United States Patent
Reiter et al.

(10) Patent No.: US 7,145,309 B2
(45) Date of Patent: Dec. 5, 2006

(54) OPEN LOOP MOTOR PARKING METHOD AND SYSTEM

(75) Inventors: Thomas J. Reiter, Dearborn, MI (US); Peter J. Pinewski, Anoka, MN (US)

(73) Assignee: Freescale Semiconductor, Inc., Austin, TX (US)

( * ) Notice: Subject to any disclaimer, the term of this patent is extended or adjusted under 35 U.S.C. 154(b) by 21 days.

(21) Appl. No.: 10/940,058

(22) Filed: Sep. 14, 2004

(65) Prior Publication Data

US 2006/0055360 A1 Mar. 16, 2006

(51) Int. Cl.
*H02P 8/00* (2006.01)
(52) U.S. Cl. .............. 318/696; 318/650; 318/685; 116/28.1; 116/62.1; 116/62.2; 116/62.3
(58) Field of Classification Search ............... 318/138, 318/254, 439, 700, 450, 650, 685, 696
See application file for complete search history.

(56) References Cited

U.S. PATENT DOCUMENTS

| | | | | |
|---|---|---|---|---|
| 3,683,254 A | * | 8/1972 | Masse et al. | 318/608 |
| 5,032,781 A | * | 7/1991 | Kronenberg | 318/696 |
| 5,117,171 A | * | 5/1992 | Bonss | 318/696 |
| 5,287,050 A | * | 2/1994 | Kronenberg et al. | 318/696 |
| 5,333,371 A | * | 8/1994 | Mittenbuhler et al. | 29/595 |
| 5,847,475 A | * | 12/1998 | Rauch et al. | 310/49 R |
| 6,014,075 A | * | 1/2000 | Fujimori et al. | 340/461 |
| 6,062,063 A | * | 5/2000 | Robson | 73/1.88 |
| 6,356,046 B1 | * | 3/2002 | Koumura et al. | 318/696 |
| 6,624,608 B1 | * | 9/2003 | Komura | 318/696 |
| 6,771,038 B1 | * | 8/2004 | Fyfe | 318/685 |
| 2003/0117100 A1 | | 6/2003 | Pigott et al. | |

FOREIGN PATENT DOCUMENTS

DE 19608480 A1 * 3/1995
EP 1-272919 * 10/1989

* cited by examiner

*Primary Examiner*—Lincoln Donovan
*Assistant Examiner*—Tyrone Smith (57) ABSTRACT

Provided herewith is an improved scheme for parking a load such as an indicator pointer and calibrating its position in a system for controlling the position of the load. The system also has a stopper for physically impeding the load when it is to be parked. In one embodiment, a parking method involves driving the motor in a reduced torque mode to move the load toward the stopper, stopping the load at the stopper while the motor is driven in the reduced torque mode, and maintaining the motor in a reduced torque mode until transitioning to an insignificant torque mode.

17 Claims, 5 Drawing Sheets

OPEN LOOP MOTOR PARKING METHOD AND SYSTEM

TECHNICAL FIELD

This invention relates generally to motor control systems, and more particularly to a method and apparatus for parking a motor load against a stopper using an open loop driven motor.

BACKGROUND

Stepping motors are compact, direct drive motors which are capable of providing rotational positioning with a high degree of accuracy. For example, such motors may be characterized with gear ratios in the neighborhood of 200:1 and can be incrementally stepped utilizing digital circuitry. For these and other reasons, stepping motors have been found to be especially suitable for use in automotive dashboard indicators such as speedometers, tachometers, and the like.

A multi phase stepping motor may be described as comprising at least first and second coils (coils A and B) aligned out of phase from one another. (For example, a two-phase stepper motor has first and second coils typically perpendicularly oriented with respect to each other.) They are driven with current signals suitably out of phase from one another (e.g., 90° for a two-phase, perpendicularly-aligned motor). The first coil may be driven by a current of a first polarity, followed by the second coil being driven by a current of the same polarity. Next, the first coil is driven by a current with a second opposite polarity followed by driving the second coil with a current of the same opposite polarity, and so on. The motor's rotor is configured to have one or more pairs of poles (e.g. five pairs of north and south poles) that are individually and selectively attracted by the magnetic fields created by driving the first and second coils as described above. In the case of a speedometer or tachometer, the driving current is related to the physical speed of the vehicle (e.g. miles per hour (mph)) or the revolutions-per-minute (rpm) of the engine, as the case may be, which may, in turn, be reflected on a gauge by a needle or pointer attached to the rotor of the stepping motor.

Some applications of stepper motors require a periodic calibration, or known parking (sometimes referred to as zeroing), of the motor due to a potential loss of synchronicity of the controller with the motor load. Closed loop detection schemes are generally disfavored because they require additional sensing circuitry. Some closed loop techniques also constrain the speed and resolution of the drive signals during detection, resulting in a choppy and slow motor movement during calibration. Unfortunately, a difficulty is encountered when stepping motors are unitized in open-loop applications of the type described above. Due to the lack of feedback, there is no way to determine if a motor has driven the needle or pointer to the correct position and no way to correct the reading if a step or steps have been lost. Furthermore, when power is removed from the stepping motor, the pointer remains in the position it occupied at the time power was turned off thus destroying the relationship between the variable being measured and displayed (e.g. mph, rpm) and the actual position of the pointer. Thus, it has been found necessary to initialize or synchronize the stepping motor with the position of the needle being driven thereby each time power is applied to the system as, for example, when the ignition is first turned on or when the system is recovering from a failure such as an over-voltage condition, an inadvertent power interruption, or the like. This establishes a predetermined and desired relationship between the stepping motor/pointer assembly and the physical parameters being displayed.

One technique for accomplishing the above described initialization or calibration involves the detection of the motor's stall condition; i.e. the condition of the stepping motor when the needle attached to its rotor is accurately positioned at the absolute zero-point of the gauge (i.e. the physical stop on a gauge, which is typically at the indicator zero position or just below it) or any other desired known position. It has been recognized that a stepping motor's stall condition can be detected by monitoring the electro-motive-force (emf) developed in the stepping motor's coils (A and B) resulting from changes in flux therein due to the rotor's motion. That is, when the motor is stopped (as for example when it strikes the mechanical stop or peg) its rotor can no longer step or turn, and no emf is generated. Thus, techniques have been developed wherein the instantaneous back emf or integrated back emf (flux over time) are monitored by comparing them with a threshold value. If the threshold value is not exceeded, the stepping motor is assumed to be in its stalled position. For a further discussion of these approaches, the interested reader is directed to U.S. Pat. No. 5,032,781 entitled "METHOD AND CIRCUIT FOR OPERATING A STEPPING MOTOR" (instantaneous emf approach), U.S. Pat. No. 5,287,050 entitled "METHOD OF SYNCRONIZATION FOR AN INDICATION INSTRUMENT WITH ELECTROMAGNETICALLY CONTROLLED STEPPING MOTOR" (instantaneous emf approach), and U.S. Pat. App. Ser. No. 2003/0117100 entitled "METHOD AND APPARATUS FOR DETECTING A STALL CONDITION IN A STEPPING MOTOR" (integrated emf approach). Such stall detect schemes may be suitable for some applications, but they have drawbacks, which make them unsuitable for many other applications. For example, time is needed between steps for the back EMF signal to settle out thereby allowing it to be accurately read, which can result in undesirably slow or choppy parking (e.g., zeroing when the physical stop is at a zero position). Other problems relate to the extra circuitry required for reading and interpreting the back EMF signals and comparing them to a preselected, "stall" threshold level.

Other known open loop techniques involve simply over-driving the motor past the physical stop and allowing the rotor, to which the load is attached, to rebound from the stop, towards the rotating magnetic field as it approaches from the opposite direction of the stop, and then pulling the pointer towards the stop again. This cycle repeats until the motor coils are no longer driven. Unfortunately, however, the repetitive collisions and direction changes of the pointer can result in undesirable noise and pointer movement, or jitter, until the controller is certain that the position of the motor is close to the stop. This technique can also result in unacceptable position inaccuracy after the movement is stopped, due to the unknown position of the rotor relative to the stop.

Accordingly, it would be desirable to have an improved open loop stepper motor parking scheme.

SUMMARY

Provided herewith is an improved scheme for parking a load such as an indicator pointer and calibrating its position in a system for controlling its position. The system also has a stopper for physically impeding the load when it is to be parked. In one embodiment, a parking method involves driving the motor in a reduced torque mode to move the load toward the stopper, stopping the load at the stopper while the motor is driven in the reduced torque mode, and maintaining it in a reduced torque mode until transitioning to an insignificant torque mode.

The foregoing has outlined rather broadly some of the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes as the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, the following description is made with reference to the accompanying drawings, in which.

DETAILED DESCRIPTION

Disclosed load parking and calibration approaches discussed herein utilize known motor and load characteristics to park and/or otherwise calibrate the position of a load such as a pointer without, in some embodiments, the need for additional circuitry or processing beyond those necessary for driving a motor in an open loop system. The result is an inexpensive technique that is easily adaptable to drive schemes using either digital (e.g., pulse width modulated) or analog approaches. As used herein, the term "parking" refers to moving a load to and stopping it at a stopper, which is fixed at a known rotational position relative to the load. Once it is "parked" at the stopper, the open-loop system can then re-calibrate load position with the knowledge that the load is at the known, stopper position. A load parking operation may be performed anytime the system requires calibration (e.g., after a fault detection or at start-up) or simply when the load is to be positioned to remain at the stopper, e.g., at shut-down. With respect to a pointer in an indicator, while a stopper will normally be located at the indicator zero position, it may be located at any other position such as behind the indicator zero. After execution of the parking operation, the load may remain at the stopper (such as at shut-down for example) or it may be moved elsewhere, such as with an indicator pointer at a point on an indicator display for indicating a specified value (e.g., when the parking operation occurs after a fault for calibrating the pointer position).

With reference to FIGS. 1 through 5, 9, and 10 before getting to the parking and calibration methods disclosed herein, an exemplary two-phase stepper motor and indicator system, suitable for implementing the disclosed parking methods, will initially be discussed. Skilled persons should recognize, however, that these methods may be utilized in any suitable system using open-loop driven motors such as stepper, DC and other electrical motors. Similarly, while the disclosed embodiments primarily discuss indicator pointers as the driven motor loads, the inventive principles also apply to any other loads that are driven within systems with physical stoppers such as doors, valves and other devices.

Figure 1:
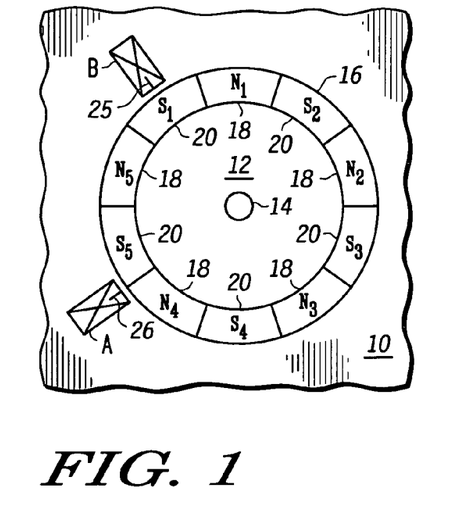
FIGS. 1, 9, and 10 are exposed plan views illustrating three sequential stages of a two-phase stepping motor as it is driven in the first three quadrants of an electrical drive cycle.
Figure 9:
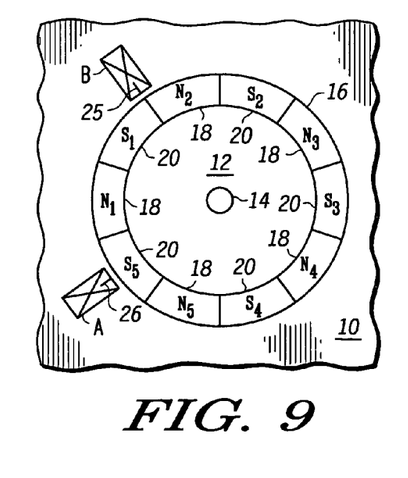
Figure 10:
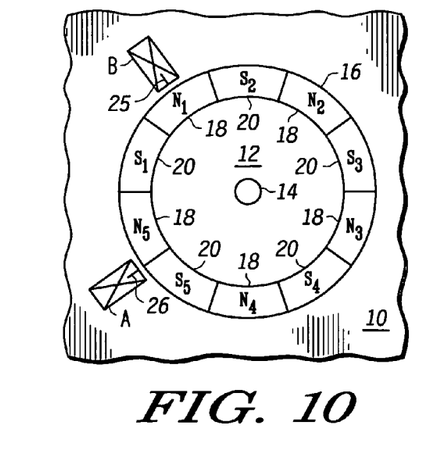

FIGS. 1, 9, and 10 are exposed plan views illustrating three sequential stages of a two-phase stepping motor as it is driven in the first three quadrants of an electrical drive cycle. As can be seen, the stepping motor comprises a housing 10, first and second coils, A and B, disposed substantially perpendicularly to each other, and a rotor 12 which rotates about an axis 14 and which has a plurality of pole-pairs. Rotor 12 has an outer portion 16 comprising a plurality of alternately spaced north poles 18 ($N_1$ to $N_5$) and south poles 20 ($S_1$ to $S_5$). Stepping motors of this type are well-known and may be of the types designed by Moving Magnet Technologies™ (MMT) located in France and Switec™ located in Switzerland.

Figure 2:
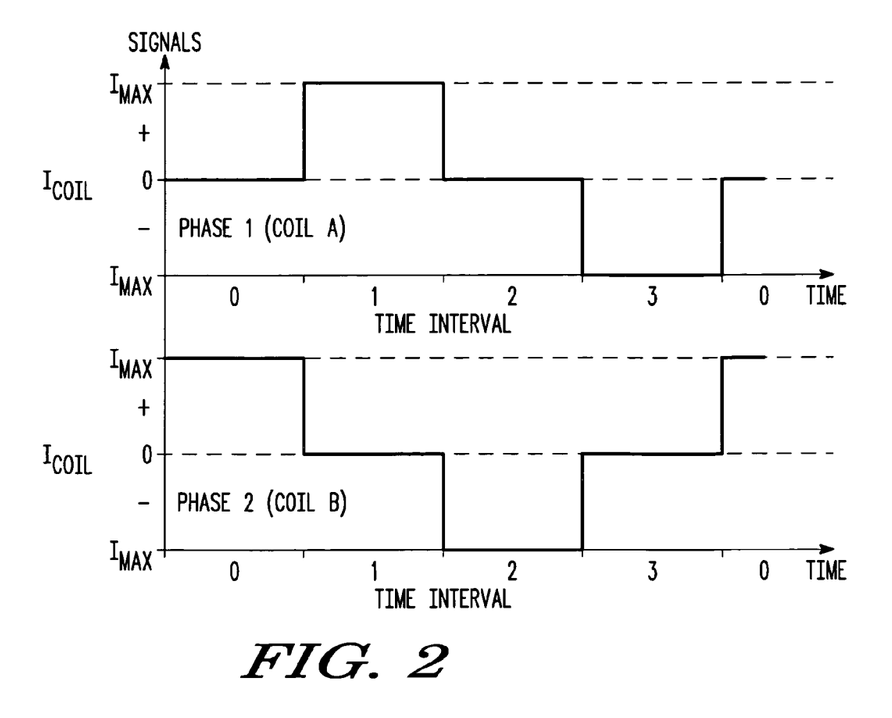
FIG. 2 shows one electrical cycle for full step driving the two-phase stepper motor of FIG. 1.

With further reference to FIG. 2 showing full step signals for driving coils A and B, an explanation of how the stepper motor is driven will now be presented. At time interval 0 (first cycle quadrant), coil B is driven with a positive current. This creates a north pole in coil B in region 25 adjacent magnetic ring 16. Thus, rotor south pole $S_0$ comes to rest adjacent coil B, as is shown in FIG. 1. It is to be noted that a second south pole $S_5$ is positioned slightly in front of coil A. At time interval 1 (second cycle quadrant), positive current is supplied to coil A, and the drive current previously applied to coil B is terminated (i.e. transitions to zero). This creates a positive pole at extremity 26 of coil A causing magnetic ring 16 and therefore rotor 12 to rotate by eighteen degrees such that south pole $S_5$ comes to rest adjacent coil A as is shown in FIG. 9. Next, at time interval 2 (second quadrant), coil B is supplied with a negative current, which creates a south pole at extremity 25 at coil B while coil A is undriven. In this case, north pole $N_1$ on magnetic ring 16 is attracted by the south pole created at extremity 25 causing it to step forward to a position adjacent extremity 25 as is shown in FIG. 10 thereby stepping rotor 12 forward another eighteen degrees. At time interval three (fourth cycle quadrant), the rotor 12 would progress (not shown) another eighteen degrees with north pole $N_5$ aligning with coil A.

Figure 3:
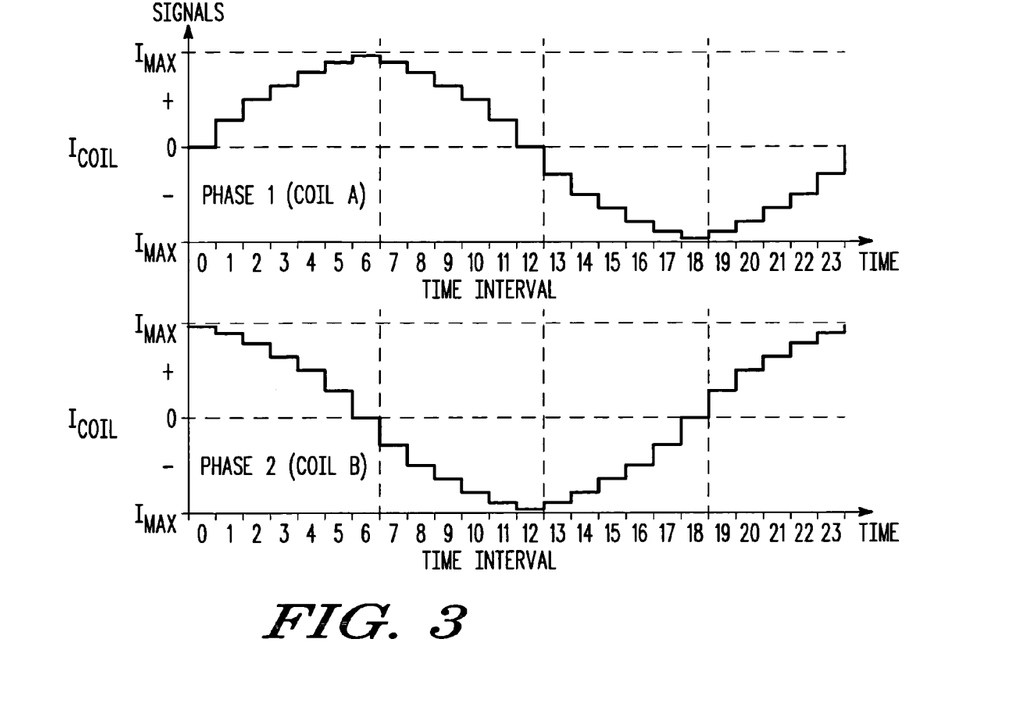
FIG. 3 shows one electrical cycle for microstep driving the two-phase stepper motor of FIG. 1.

It is well known that by choosing the appropriate drive currents, half-stepping or even micro-stepping can be achieved. (For example, signals for driving rotor 12 in a similar manner for one electrical cycle using micro-steps are shown in FIG. 3. Micro-stepping generally results in smoother rotor rotation, and it also provides greater flexibility in controlling drive parameters including acceleration, velocity, and torque.) Thus, by providing drive currents to coil A and coil B as shown in FIG. 2 or 3 and by suitably controlling their magnitudes, step widths, and/or frequencies, rotor 12 can be caused to rotate in a desired, controllable manner. Since the production of control voltages and currents for stepping motors is well known, further discussion at this time is not deemed necessary.

Figure 4:
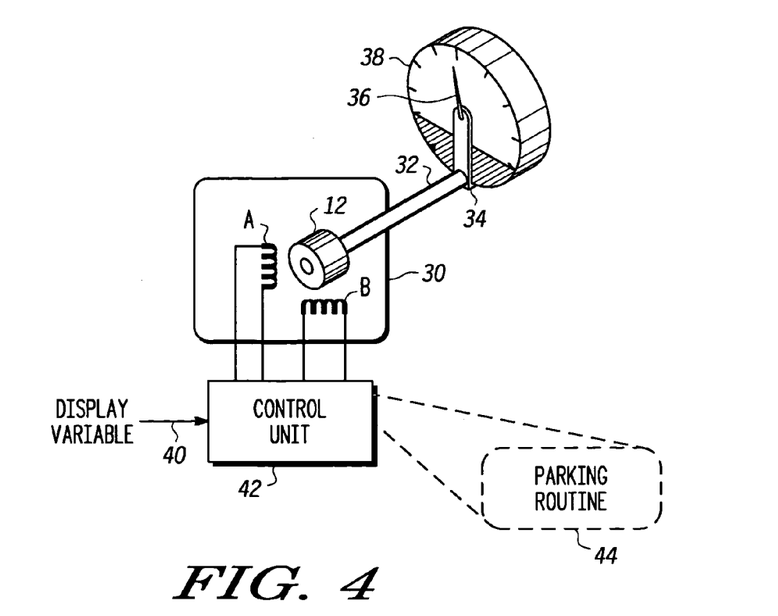
FIG. 4 schematically depicts an open loop stepper driven indicator system according to one embodiment of the present invention.

FIG. 4 illustrates a stepping motor 30 having coils A and B which can be driven as previously described to cause rotor 12 to turn. Rotor 12 is coupled by means of a shaft 32 and transmission 34 to an actuator load in the form of a needle or pointer 36 on an indicator or gauge 38. The shaft and transmission, in connection with the motor rotor, may have an appropriate linkage (or gear) ratio for suitably controlling the pointer in cooperation with the motor. For example, in one application, with a 180:1 ratio, the pointer moves $\frac{1}{180}^{th}$ of a revolution for every 1 rotor revolution thereby providing greater pointer resolution over the range of pointer motion. A signal representative of a variable such as vehicle speed or motor rpm to be displayed at gauge 38 is applied to an input 40 of control unit 42. In one embodiment (e.g., when control unit 42 is a driver interface device), control unit 42 contains the appropriate logic to convert the magnitude of the signal appearing at input 40 to a number of steps that stepping motor 30 must be rotated in order that pointer 36 accurately reflect a measurement of the display variable. Control unit 42 also includes (or has access to) the appropriate logic (e.g., state-machine logic, machine instructions, etc.) for performing a parking routine 44, discussed in the next section. (Control unit 42 generally represents a device, number of devices, or device portion that controls signals for driving the motor 30. For example, it could be a single, state-machine implemented driver device that interfaces between a processor and the driven motor; a processor device comprising one or more separate components, or a suitable combination of IC and/or discrete components.)

Figure 5:
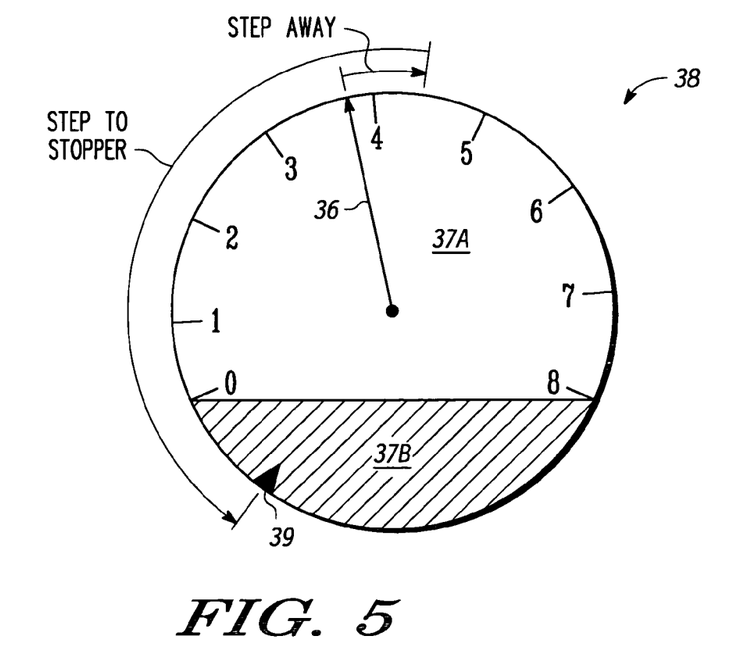
FIG. 5 diagrammatically shows the front portion of an indicator depicted in FIG. 4.

FIG. 5 shows a partial schematic view of the front portion of indicator 38 illustrating both an indicator display portion 37A and a non display portion 37B. The display portion 37A shows pointer 36, which points to an appropriate display variable corresponding to the variable signal inputted to control unit 42. With the indicator in the depicted drawing, generic values ranging between 0 and 8 can be indicated. The non-display portion 37B includes a pointer stopper 39 mounted at a known location (internal to the indicator assembly) along the pointer's rotational path. In the depicted embodiment, stopper 39 is positioned behind (from a counter-clockwise standpoint) the indicated zero position. Stopper 39 serves to sufficiently impede pointer 36 causing it to stop when the pointer is parked, pursuant, for example, to a position-to-zero operation. (A parking operation may be initiated by control unit 42 to calibrate the pointer position or to place it at zero such is at shut-down.)

Pointer Parking Method

Figure 6:
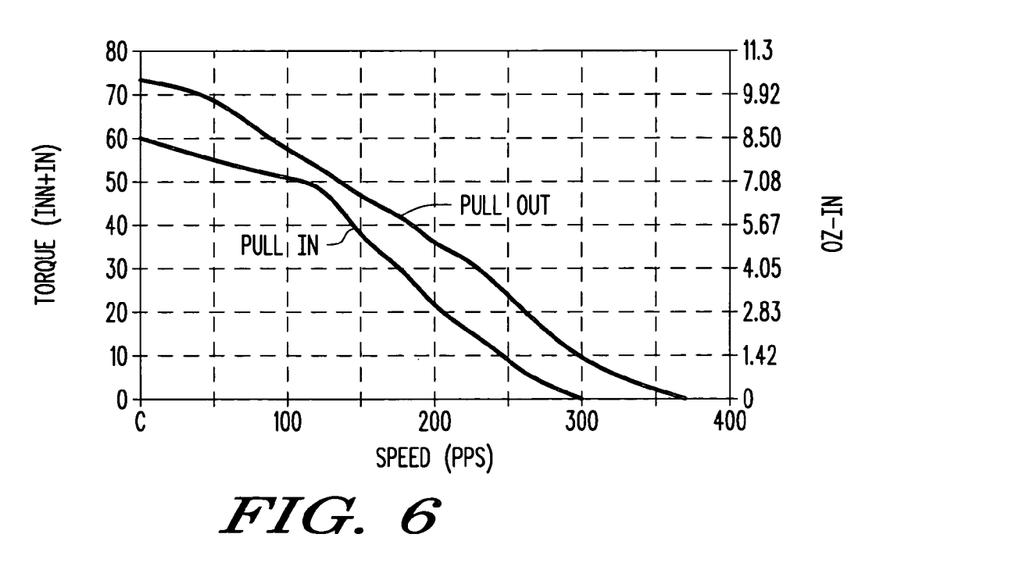
FIG. 6 shows available system torque versus rotor speed curve for a stepper motor system.
Figure 7:
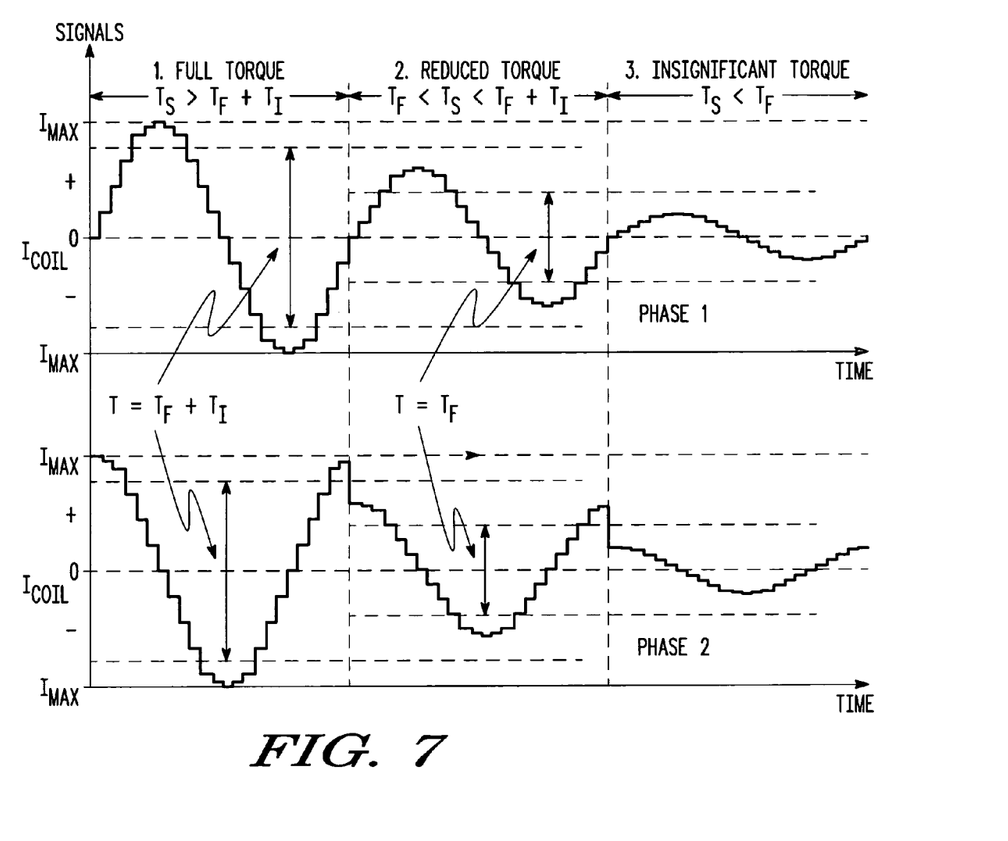
FIG. 7 shows coil drive currents for transitioning between torque modes pursuant to one embodiment of the present invention.
Figure 8:
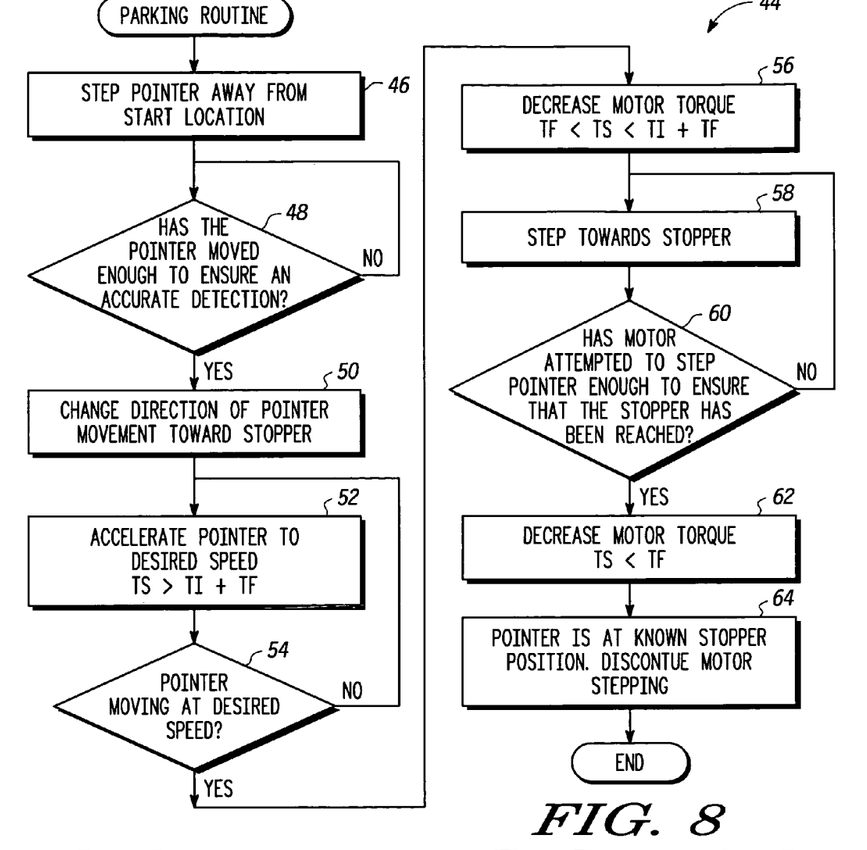
FIG. 8 shows a pointer parking routine for one embodiment of the present invention.

With reference to FIGS. 6 through 8, a method for parking a pointer at a stopper will now be discussed. Accurately controlling and positioning a stepper motor with a pointer load generally requires that the motor is capable of generating the necessary system torque, $T_s$, to exceed the overall resistive torque at expected operating accelerations, decelerations, and speeds. The disclosed parking methods take advantage of this in order to operate the pointer in a controllable, reduced torque mode that results in the pointer stopping at the pointer stopper without bouncing or jumping back due to the magnetic fields produced by the coils, which continue to be driven even after the pointer has reached the stopper. (Remember that with open loop operation without a stall detect or the like, the control unit continues driving the coils until it can be sure that the pointer, regardless from where it started on the indicator, reaches the stopper.)

For purposes of implementing the disclosed parking methods, the resistive torque that the motor must overcome may be estimated as:

$$T_r = T_f + T_i$$

where $T_f$ is the frictional torque component, which is basically constant and independent of rotor speed, and $T_i$ is the inertial torque component, which is dependant upon the speed and size of the rotor load including the linked pointer. Thus, in order to accelerate the pointer, the available system torque must be greater than the overall resistive torque ($T_f + T_i$). When the available system torque is greater than this amount, it is said to be in a "full torque" mode. Alternatively, when the available system torque is less than $T_f + T_i$ but greater than $T_f$ the system is operating in a "reduced torque" mode, and when it is less than $T_f$, it is in an "insignificant torque" mode. The relevance of these separate operational torque modes will become more apparent below.

The available system torque ($T_s$) is primarily dependent on coil drive current speed (frequency) and drive coil current magnitude. As indicated in FIG. 6, drive current speed inversely affects available system torque. That is, a stepper motor driven with a high velocity has less available torque than the same motor at slow speeds. On the other hand, the available system torque is proportional to the amount of current driving the motor coils. Thus, a motor can be controlled to operate in a selected one of the afore-mentioned torque modes (full, reduced, insignificant) by controlling the coil current magnitude in connection with the operating speed of the coil drive currents.

With reference to FIGS. 7 and 8, one embodiment of a routine for performing a pointer-to-stopper calibration routine will now be discussed. The approach generally involves accelerating the pointer towards the stopper until a sufficient speed is reached so that in connection with sufficiently reduced coil currents, the driven pointer can transition from a full to a reduced torque mode, as is depicted in FIG. 7. The pointer is then driven to remain in this reduced torque mode until enough steps have occurred to ensure (regardless of its initial position) that the pointer reaches the stopper. It is maintained in a reduced torque mode and then transitioned into an insignificant torque mode. That is, it is not allowed to fall back or spike into a full torque mode. In one embodiment, this is achieved by maintaining the drive current speed even after the pointer hits the stopper while reducing its magnitude to transition it into an insignificant torque mode. Because the pointer hits the stopper while in a reduced torque mode and remains in this mode until transitioning into an insignificant torque mode, it essentially "sticks" to the stopper, even as the coils continue to be driven. Remember that in a reduced torque mode, there is enough available system torque to overcome friction (and maintain a constant pointer speed) but not enough to overcome a change in inertia, which occurs when the pointer hits the stopper and stops. In prior parking methods, the pointer would hit the stopper in a full torque mode or in a reduced torque mode but then allowed to fall back into a full torque mode, which caused the pointer to jump back when the electrical drive field came sufficiently around to in essence, pull the needle off of the stopper from behind.

With reference to FIG. 8, one embodiment of a routine 44 for parking a pointer, such as pointer 36 with the indicator of FIGS. 4 and 5, will now be described. Initially, at step 46, the pointer is stepped away from its current position (wherever that may be on the indicator when the parking routine is initiated). The pointer is stepped sufficiently away to ensure that there is enough distance between it and the stopper so that when it is driven to the stopper, there is sufficient separation (and thus time) to accelerate it to a desired speed and then to be able to sufficiently reduce the available system torque at that speed to transition it into a reduced torque mode before it hits the stopper. Decision step 48 reflects this by looping until the pointer has stepped sufficiently back to ensure attainment of a reduced torque mode when the pointer hits the stopper.

Once the pointer has stepped sufficiently away, the routine proceeds to step 50 and then 52. Here, the pointer is stepped toward the stopper in order to accelerate it to a desired speed, which is confirmed through decision loop 54. As with the previously performed stepping away, the pointer movement can be in microsteps, if desired, for fast and smooth pointer motion. For this part of the procedure, the system is in a full torque mode so that the pointer load can be accelerated, under full control, to the desired speed. the desired speed will be different for different designs and will depend upon particular system parameters. However, regardless of design, this speed should be high enough to result in a sufficiently low available system torque so that the system can efficiently transition into a reduced torque mode with a reasonable reduction of drive current.

After the pointer acceleration is complete and the desired pointer speed is reached, then the routine proceeds to steps 56 and then 58, where the available motor torque is decreased to a reduced torque, i.e., a level between $T_f$ and $T_f+T_i$. This reduction in motor torque is accomplished by reducing the motor phase current amplitude as shown in FIG. 7. The motor then continues to be driven with these reduced amplitude electrical phase currents at a constant speed for enough steps to ensure that the pointer reaches the stopper, which is confirmed at decision loop 60. Even though the magnetic field will continue to rotate around the stator as long as the electrical signal is supplied to the motor coils, the rotor movement is no longer aligned to the magnetic field and the pointer stops moving. In one embodiment, this is achieved by decreasing the magnitude of the coil drive current (but not significantly reducing drive current speed) to reduce available system torque. The pointer will not move backwards towards the magnetic field as the vector approaches because the system is held in a reduced torque mode until transitioning to an insignificant torque mode, and the motor torque generated in the reduced torque mode is insufficient to overcome the inertial torque.

As indicated at step 62, the signal amplitude is then further reduced to levels below those necessary to overcome the frictional torque of the system. Once the motor torque can no longer overcome the frictional torque, then it is insignificant and can be removed from the motor without affecting the pointer position. From here, the pointer is at the stopper, as indicated at step 64, and can remain there or the control unit can re-calibrate itself and move the pointer to a desired indicator position.

It should be noted that the calibration may be off by some amount up to but less than the distance of one motor revolution. That is, from the control unit's standpoint, the system does not necessarily know what electrical quadrant or microsteps within an electrical quadrant corresponds to the actual rotor position when the pointer is at the stopper. That is, when moving the pointer to a position off of the stopper, it may not know where, in the electrical cycle, to begin the drive signal. To redress this problem, the electrical signal angle (when the pointer is aligned with the stopper) can be provided to the control unit, for example, by providing it in a memory unit or loading it into a register. The control unit can then start driving the motor at this electrical angle when the pointer is moved after a parking operation.

The electrical angle with respect to pointer stopper position may be provided by a manufacturer or it may be determined in any of several ways. For example, when the pointer is first assembled to the motor, one could use visual test equipment or even a stall detection method to determine the exact electrical angle when the pointer touches the stopper. This information could then be saved, for example, in non-volatile memory for use by the system during subsequent pointer calibration events.

Although the invention has been described with reference to specific examples, it would be appreciated by those skilled in the art that the invention may be embodied in many other forms. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim:

1. In a system having a load, an available system torque, and a linked motor for positioning the load, the system further having a stopper for physically impeding the load when it is to be parked, a method for parking the load at the stopper, comprising:
   driving the motor in a full torque mode to move the load toward the stopper, wherein in the full torque mode the available system torque is greater than a sum of a frictional torque component related to the system and an intertial torque component related to the system;
   before reaching the stopper transitioning from the full torque mode into a reduced torque mode, wherein in the reduced torque mode the available system torque is lower than the sum of the frictional torque component and the inertial torque component, but is greater than the frictional torque component;
   stopping the load at the stopper while the motor is driven in the reduced torque mode; and
   maintaining the reduced torque mode until transitioning to an insignificant torque mode, wherein in the insignificant torque mode the available system torque is lower than the frictional torque component.

2. The method of claim 1, wherein the load is a pointer in an indicator.

3. The method of claim 1 wherein the motor is driven with microsteps.

4. The method of claim 1, wherein the act of driving the motor to position the load toward the stopper includes (i) accelerating the load to reach a desired load speed with the motor being in a full torque mode, and (ii) reducing available system torque without substantially reducing drive current speed to transition from the full torque mode to the reduced torque mode.

5. The method of claim 4, further comprising initially stepping the load away from its current position prior to accelerating it toward the load.

6. The method of claim 5, wherein the act of maintaining the reduced torque mode until transitioning to an insignificant torque mode includes decreasing the magnitude of a drive current while substantially maintaining its speed.

7. The method of claim 1, wherein the motor is a stepper motor.

8. An integrated circuit device having logic to perform the parking method of claim 1.

9. An open loop method for calibrating the position of a load driven by a motor, the method comprising:
   driving the motor in a full torque mode to move the load toward a stopper, wherein in the full torque mode an available system torque is greater than a sum of a frictional torque component related at least to the motor and the load and an intertial torque component related at least to the motor and the load;
   before reaching the stopper transitioning from the full torque mode into a reduced torque mode, wherein in the reduced torque mode the available system torque is lower than the sum of the frictional torque component and the inertial torque component, but is greater than the frictional torque component;
   parking the load at the stopper in the reduced torque mode;
   maintaining the reduced torque mode until transitioning to an insignificant torque mode, wherein in the insignificant torque mode the available system torque is lower than the frictional torque component; and
   updating load position based on the known position of the stopper.

10. The method of claim 9, wherein the act of updating the load position includes incorporating the electrical angular position of the load when it is at the stopper.

11. The method of claim 9, wherein the act of parking the load includes driving a stepper motor to the load to accelerate it toward the stopper until a desired load speed is attained, and reducing the available system torque for driving said motor in order to transition to a reduced torque mode before the load reaches the stopper.

12. An integrated circuit device configured to perform the calibration method as recited in claim 9.

13. An indicator system, comprising:
   an indicator having a pointer for indicating a specified value;
   a motor linked to said pointer to position it at a desired position within the indicator;
   a stopper configured to stop the pointer at a known position within the indicator; and
   a control unit adapted to control the stepper motor, the control unit being capable of controlling the stepper motor to:
      drive the motor in a full torque mode to move the load toward the stopper, wherein in the full torque mode an available system torque is greater than a sum of a frictional torque component related to the indicator system and an intertial torque component related to the indicator system,
      before reaching the stopper to transition from the full torque mode into a reduced torque mode, wherein in the reduced torque mode the available system torque is lower than the sum of the frictional torque component and the inertial torque component, but is greater than the frictional torque component, and
      park the pointer at the stopper in the reduced torque mode and to maintain it in said reduced torque mode until transitioning to an insignificant torque mode, wherein in the insignificant torque mode the available system torque is lower than the frictional torque component.

14. The system of claim 13, wherein the control unit has access to the electrical angle of the motor when the pointer is at the stopper.

15. The system of claim 13, wherein the stopper is mounted within the indicator.

16. The system of claim 13, wherein the control unit is adapted to cause the motor to drive the pointer and park it at the stopper using microsteps.

17. An integrated circuit driver device configured to implement the control unit of claim 13.

* * * * *